US006222119B1

(12) United States Patent
Turunen

(10) Patent No.: US 6,222,119 B1
(45) Date of Patent: Apr. 24, 2001

(54) CABLE CONNECTORS

(75) Inventor: Timo Turunen, Kungsängen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/449,619

(22) Filed: Nov. 30, 1999

(30) Foreign Application Priority Data

Dec. 1, 1998 (SE) .................................................. 9804154

(51) Int. Cl.[7] ....................................................... H05K 9/00

(52) U.S. Cl. ......................... 174/35 R; 361/818; 361/688

(58) Field of Search ........................ 174/35 R; 331/81 B; 361/688, 818; 439/278

(56) References Cited

U.S. PATENT DOCUMENTS

| | | | | |
|---|---|---|---|---|
| 4,828,507 | | 5/1989 | Nagase et al. . | |
| 5,227,581 | | 7/1993 | Riviere et al. . | |
| 5,638,259 | * | 6/1997 | McCarthy et al. | 174/35 R |
| 6,018,125 | * | 1/2000 | Collins et al. | 174/35 R |

FOREIGN PATENT DOCUMENTS

WO 95/28075 10/1995 (WO) .

* cited by examiner

*Primary Examiner*—Shawn Riley
(74) *Attorney, Agent, or Firm*—Burns, Doane, Swecker & Mathis, L.L.P.

(57) ABSTRACT

The invention is a device for environmentally protected connection of cables. The invention consists of a cassette (1), which can be opened and removed and which contains the contact devices (3). The cassette (1), which is placed in an opening (18) in a cabinet (17) containing electronic equipment, is provided with ventilation holes (10), which make circulation possible between the volume “B” therein and the climatized volume “C” within the shell of the cabinet (17). Thus, good climate equalization can be achieved between volume “B” and “C”. Since the cassette (1) is designed so that it is EMC-shielding between volume “B” and volume “C” and since the incoming cables (2) enter through an environmental seal (6), the equipment is in volume “C”, which is environmentally protected, i.e. EMC-protected and climate-protected, at the same time as the contact surface between the incoming contacts (3) and the chassis contacts (13) are climate-protected.

5 Claims, 5 Drawing Sheets

CABLE CONNECTORS

This application claims priority under 35 U.S.C. §§119 and/or 365 to 9804154-4 filed in Sweden on Dec. 1, 1998; the entire content of which is hereby incorporated by reference.

1. Technical Field

The present invention relates to the technical field of cable connectors and in particular it relates to a device for environmentally protected connection of cables.

2. Related Art

Electronic equipment must often be protected from the ambient environment in order to function effectively. Negative effects on the function of the equipment include extreme temperatures, moisture, dirt, disruptive electromagnetic disturbance (EMC) and mechanical disturbance. The protection of the equipment usually consists of completely encapsuling the equipment. One problem with encapsuling is that the protection is often inadequate in the interface of the electronic equipment to the surroundings: power supply, signal cables etc.

An illustrative example of this problem is connectors for connecting incoming and outgoing cables to radio base stations placed outdoors. These radio base stations are climatized to keep a suitable operating climate for the equipment. The contacts are placed in the interface between two climate zones: the climatized zone inside the radio base station and the outdoor climate. If the surroundings are warmer than the climatized zone, the air will be cooled down at contact with the interface between the climate zones, and moisture in the air will condense, thereby subjecting the contacts to water and moisture, and this is particularly the case in areas having a warm moist climate. Moisture and water on the electrical contact surfaces can result in short-circuits or major disruptions in the flow of signals passing through the contacts.

WO95/28075 describes an EMC-shielding cable connector for circuit boards mounted in a magazine. According to this invention, the end of a cable coming from outside is provided with a box-shaped container which is pushed into a receiving container mounted in a hole in the wall of the magazine. The receiving container is then in electrical contact with both the cable protector and the wall of the magazine, and thus shields the circuit board against EMC. This known design, however, does not deal with the climate protection aspect.

A previously known solution to the problem of environmentally protecting connectors is to use special connectors designed for difficult environmental conditions. The disadvantage of this solution is that these connectors are very expensive.

Other known solutions to the same problem are to fix hoods of various designs and materials around the connector. This solution has a number of problems:

The protector is easily forgotten during installation and service.

Problems of visual inspection since the hood must be removed before beginning inspection.

Difficult to provide a comprehensive protection, and the connector can be subjected to moisture and dirt despite the protector.

Assembly and disassembly of the hood can be relatively time-consuming, making the installation and service costs unnecessarily high.

DESCRIPTION OF THE INVENTION

The present invention addresses the problem of how electrical equipment connectors can be securely, robustly and economically environmentally protected, i.e. protected against dust, EMC, moisture, extreme temperatures etc.

A purpose of the present invention is thus to achieve a device for cable connection in such a manner that the connector is securely protected against the effect of varying climate conditions.

Another purpose of the invention is to achieve a device for climatically protected cable connection in such a manner that the climatic protection can hardly be forgotten during installation and service.

An additional purpose of the invention is to achieve a device for cable connection in such a manner that it is relatively simple to make the connection itself, thus reducing installation and service costs.

In short, the invention involves placing the contacts inside a removable cassette provided with installation holes. This cassette can be placed in a space adapted thereto in a cabinet containing electronic equipment. The volume in the cassette is a special environmental zone separate from both the volume outside the protective shell of the cabinet and the rest of the volume inside the shell. At the interface to the outer environmental zone, the cables pass through an environmental seal while the contacts to the inner connections are at the interface to the inner climatic zone. In conjunction with the climate inside the shell, a good equalization between the environmental zones can be obtained for the equipment and the cassette.

Since the climatic protection is integrated with the cassette, which can be both opened and removed, installation and service will be simple since the cassette can be moved aside to a place where the work is relatively simple to perform.

Since the cassette is also made so that it is EMC-shielding, the electronic equipment will be in a volume which is both climatically and EMC-protected, at the same time as the contacts are climate-protected.

The invention will now be described with the aid of preferred embodiments and with reference to the accompanying drawings.

LIST OF FIGURES

PREFERRED EMBODIMENT

Figure 1:
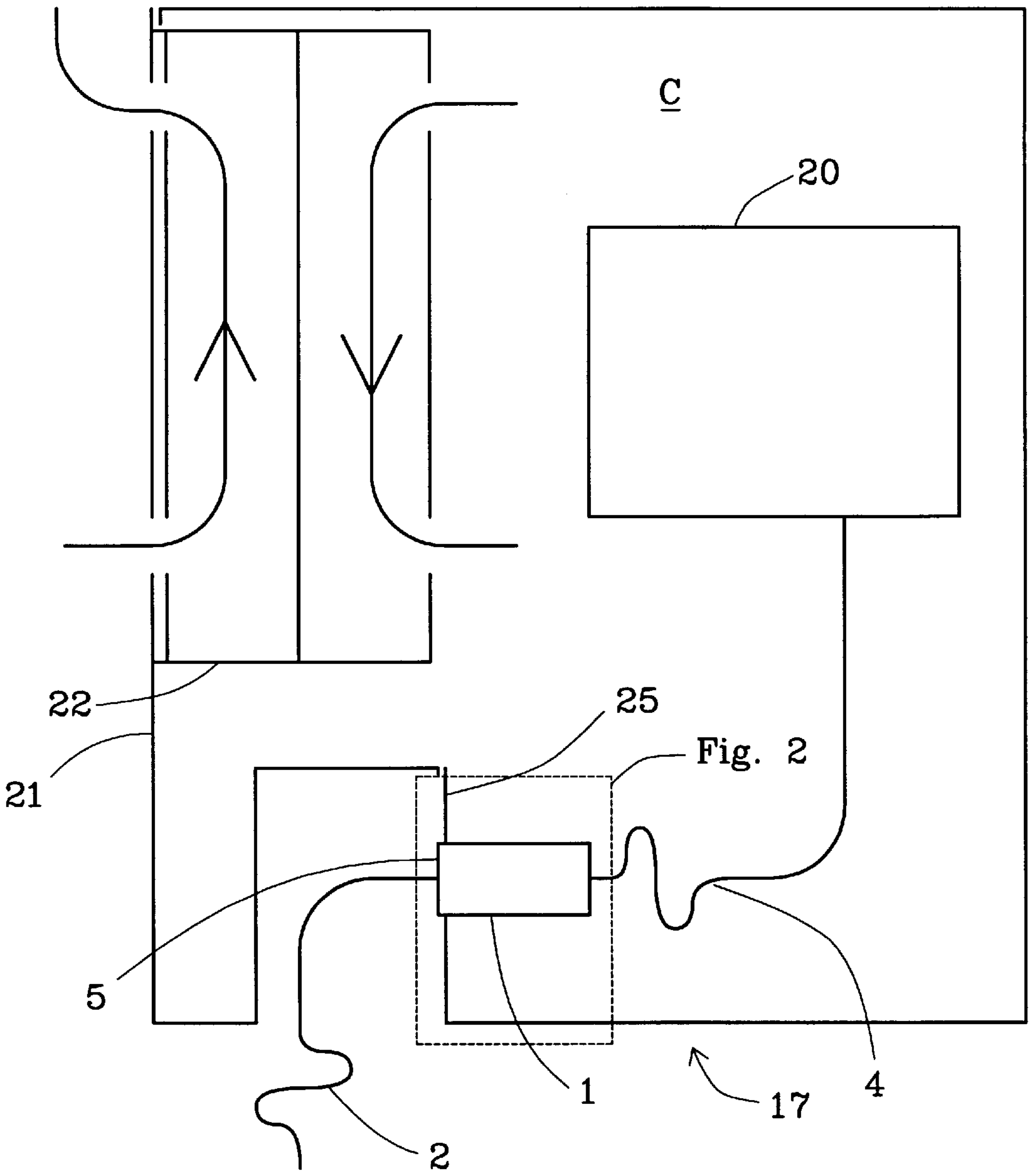
FIG. 1 shows a cross-section of the device according to the invention mounted in a cabinet placed outdoors.

FIG. 1 shows a cross-section through the device according to the invention mounted in a cabinet placed outdoors. 17 designates the cabinet containing electronic equipment 20. The cabinet 17 comprises a door 21, an internal wall 25 and a climate control unit 22 fixed to the inside of the door 21. The climate control unit 22 controls in a known manner the climate in an inner volume "C". The device itself according to the invention consists of a cassette I in which a number of cables 2 coming from outside and a number of internal cables 4 leading to the electrical equipment 20 are connected. The cables 2 enter the cassette 1 via a climatically protecting front 5 which, when the cassette 1 is provided with a number of ventilation holes (not shown), results in the cassette 1 being in essentially the same climate as the volume "C". Since the cassette 1 is removable and since the cables 2, 4 are mounted with a certain amount of slack, the cassette 1 can be moved a certain distance without having to disconnect the cables 2, 4.

Figure 2:
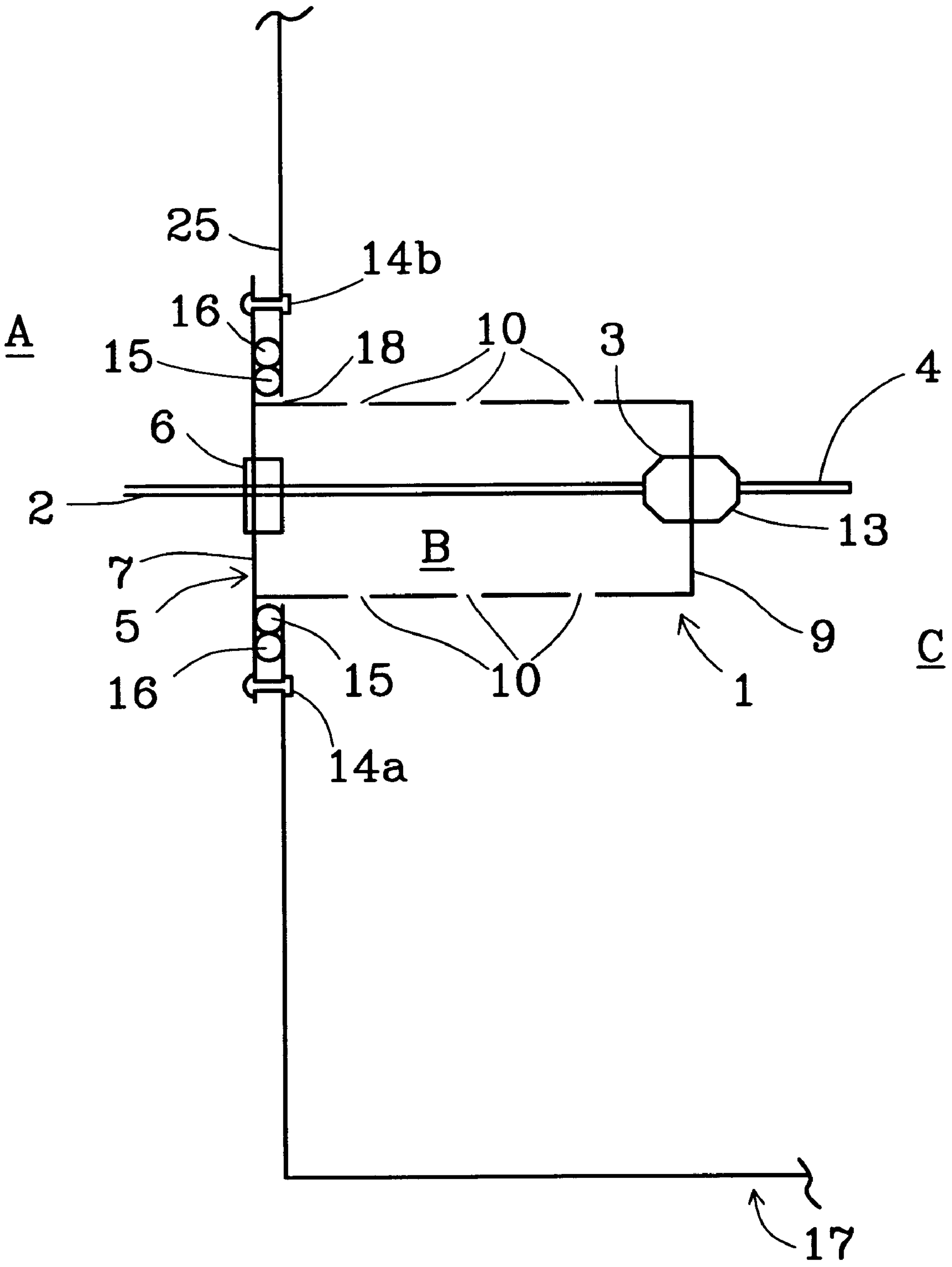
FIG. 2 shows a cross-section of the device according to the invention and how it divides up a volume into different EMC- and climatic zones.

FIG. 2 is cross-section which shows in more detail the device according to the invention mounted and how it divides up a volume into different EMC and climatic zones. In the figure, 17 designates, as in FIG. 1, a cabinet containing electronic equipment (not shown). The cassette 1, cut away for the sake of illustration, is seen from the side inserted into the cabinet 17 through an opening 18 adapted thereto in the inner wall 25. "A" designates a volume, either outdoors or indoors, which does 10 not necessarily have to be climatically protected or EMC-shielded. "C" designates a climatized volume in the cabinet 17, in which the electronic equipment is housed. The volume "C" can be climatized by means of the climate control unit 22 shown in FIG. 1, if necessary. 15 designates an EMC-strip and 16 an environmental strip, placed either on the cabinet 17 or the front 5, so that they completely surround the 15 opening 18 and still leave room for the attachment devices, e.g. screws 14*a,* 14*b,* which attach the cassette 1 to the cabinet 17. The environmental strip 16 is placed radially on the outside and thus protects the EMC-strip 15 as well. The EMC-strip 15 is along its entire length substantially in contact with both the cabinet 17 and the cassette 1, both of which are substantially of EMC-shielding material, thereby obtaining EMC-shielding of the volume "C" as well. Since the environmental strip 16 is, along it entire length, substantially in contact with both the cassette 1 and the cabinet 17, and since the cassette 1, through a number of ventilation holes 10, permits air to circulate to and from the zone "C", a volume "B" is obtained in the cassette 1, which is climatically protected.

Figure 3:
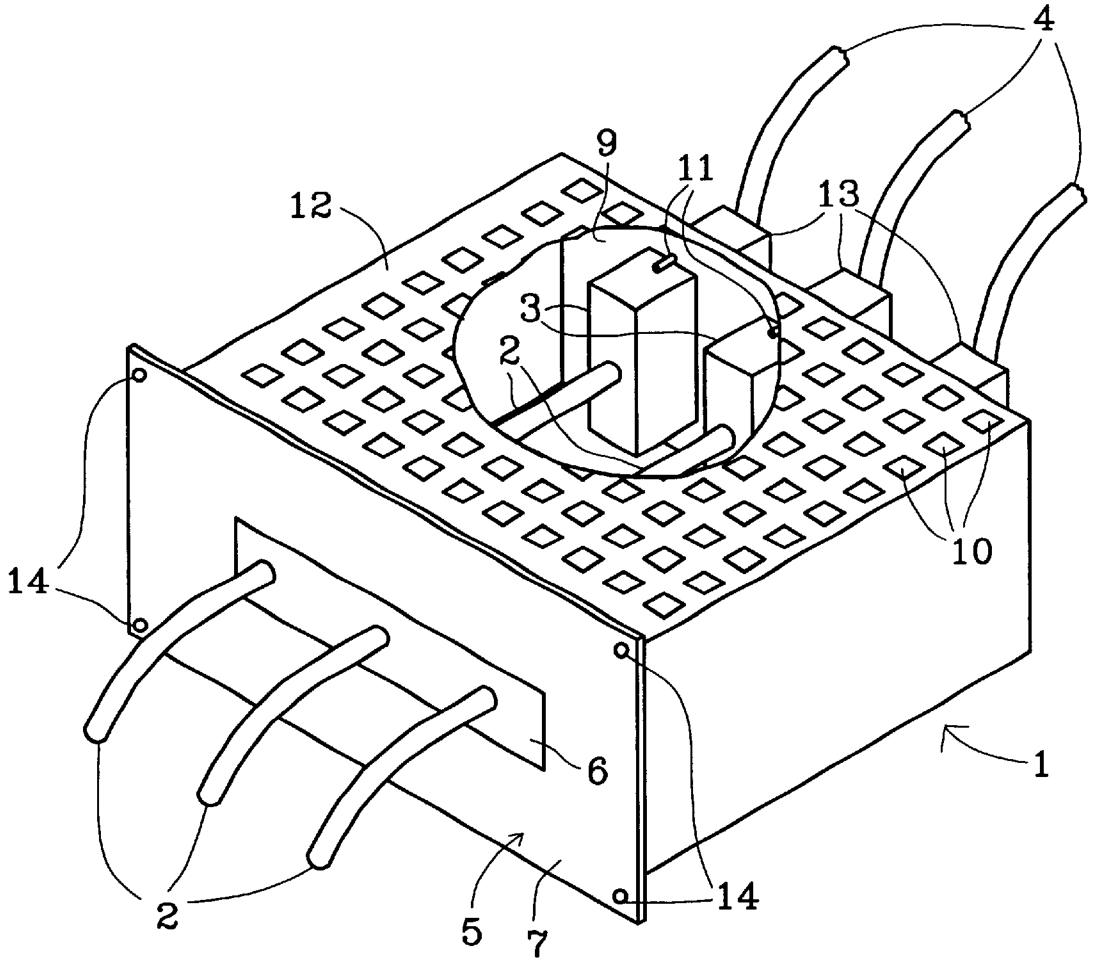
FIG. 3 shows an embodiment of the device according to the invention, as seen in perspective.

FIG. 3 shows an embodiment of the device according to the invention as seen in perspective and with the same reference numerals as in FIG. 2. 1 designates a cassette essentially of metal or other EMC-shielding material. In one end of the cassette 1 there is a removable front 5, comprising a front plate 7 and an environmental seal 6 of a known type. The environmental seal 6 is fixed to the front plate 7 in a known manner. The environmental seal 6 is provided with, and/or has the possibility of being provided with, a number of holes, one for each of the number of through cables 22 led through the front 5. The entire front 5 is fixed to the internal wall 25 by means of screw-fasteners 14*a,* 14*b* through screw holes 14 adapted thereto.

The upper surface of the cassette 1 in FIG. 3 is partially removed to show the passage of the cables 2 in the cassette to individual contacts 3. The cables 2 go through the cassette 1 and each is provided at its extreme end with a contact 3, the form of which depends on the purpose. They can, for example, be so-called D-subcontacts for signal transmission or contacts for power transmission. The contacts 3 are fixed in some manner, for example by means of screws 11, in one of the walls of the cassette 1, in this figure a rear plate 9, which is provided with a number of contact holes (not shown), in order to make it possible for a number of chassis contacts 13 placed on the other side of the backplate 9, to establish electrical contact with the contacts 3 in the cassette 1. In the backplate 9 there are also those arrangements, e.g. screw holes (not shown), needed to fix the outer contacts 3 and the chassis contacts 13 to the backplate 9. To the chassis contacts 13 there are connected a number of cables 4, connected at their other ends to the electronic equipment (not shown), thereby coup-ling the incoming cables 2 to this equipment. The cables 2 and 4 are mounted with a certain amount of slack to make it possible to move the cassette a short distance without having to discontect the cables from the cassette.

In order for i.a. the chassis contacts 13 and the outer contacts 3 to be in essentially the same climate, a number of walls of the cassette 1, in this case a cover 12 (partially cut away in the figure for the sake of illustration) and a bottom (not shown) are provided with a number of holes 10 arranged in such a manner as to preserve the EMC-shielding intact. Through these holes 10, air can freely flow in a known manner and thus make the climate essentially the same for both the chassis contacts 13 and the outer contacts 3. To facilitate installation and service, parts of the cassette 1, in this case the cover 12 and the bottom, are removable since they are fixed, for example by means of screws, in such a manner that the EMC-shielding is intact. In order to be able to fix the cassette 1 securely in its intended location, it can be provided, for example, with a number of screw holes 14, each having its counterpart at the location where it is to be mounted.

Figure 4:
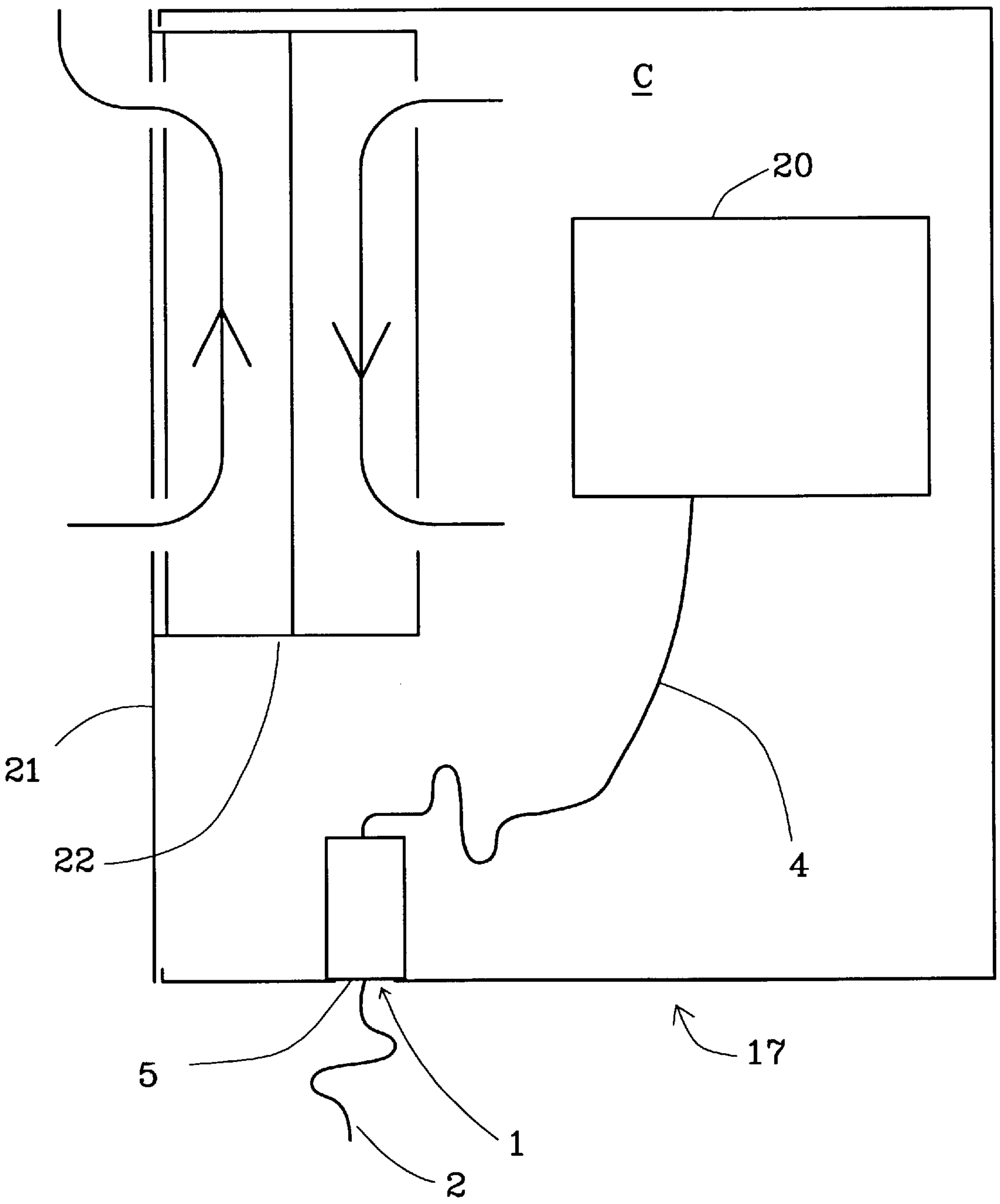
FIG. 4 shows a cross-section as in FIG. 1 but with another embodiment of the device according to the invention.

FIG. 4 shows the same view as FIG. 1, but with the essential difference that the device is mounted differently in the cabinet. In the figure, the cassette 1 is placed on and fixed to the bottom of the cabinet 17. Otherwise, FIG. 4 is essentially analogous to FIG. 1.

Figure 5:
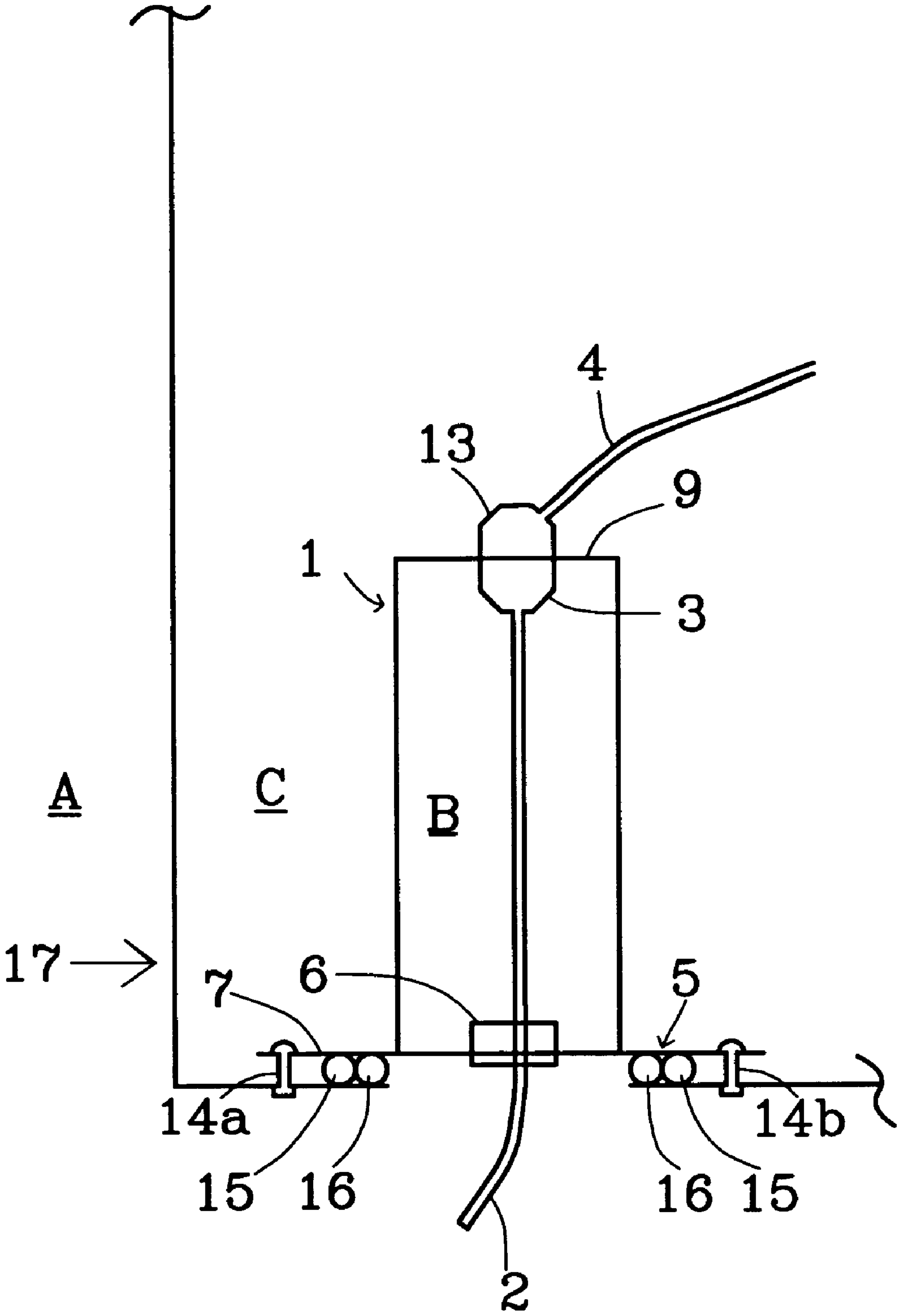
FIG. 5 shows the embodiment according to FIG. 4 in essentially the same view as in FIG. 2.

FIG. 5 shows in more detail the embodiment of the invention which is shown in FIG. 4. The difference from the device in FIG. 2 is that the EMC-strip 15 and the environmental strip 16 in this figure are on the other side of both the cabinet 17 and the front 5. In this case, the cassette 1 is not inserted into the cabinet 17 but is attached to the inside thereof. This makes it possible for the cassette 1 to be fixed to the floor of the cabinet 17.

The form of the cassette 1 can vary to adapt it to the space for which it is intended.

The basic construction is the same, however, regardless of whether the cassette 1 is in the form of a rectangular prism, as above, as a cylinder, or in some other geometric shape.

When connecting cables, the installer performs, for example, the following steps (the service procedure does not differ substantially therefrom):

1. He unlocks and opens the door to the cabinet.
2. He unscrews the screws fixing the cassette to the cabinet.
3. He moves the cassette a short distance so that it is easy to work with.
4. He removes the front, cover and bottom.
5. He removes the environmental seal from the front plate.
6. If the cables from the electronic equipment are not already fixed to the container, he fixes these at their intended locations.
7. He threads the cables coming from the outside through the front plate.
8. He couples each of the cables coming from outside to the correct contact and fixes the contacts to the cassette.
9. If not already done, he prepares the environmental seal so that it has a number of holes corresponding to the cables coming from the front.
10. He mounts the environmental seal to the front plate seeing to it that the cables actually go through the holes intended for them in the front strip.

11. He mounts the front, cover and bottom.

12. He returns the cassette to its intended location and fixes it there.

13. He closes and locks the door.

Since the holes in the cassette 1 permit air to circulate through the interior (volume "B") of the cassette 1, to the protected inner volume "C", this makes possible optimal climate equalisation between these volumes, which allows the climate to be essentially the same in these two volumes. This applies in whatever manner the inner volume "C" is climatized: with a heat exchanger, ventilation or the like, and when it is not climatized at all. Since the device according to the invention is designed to be EMC-shielding, the EMC-shielding of the inner volume is not affected appreciably. Thus, it should be apparent that the cable connections with the device according to the invention are climate protected at the same time as the EMC-shielding of the inner volume "C" is maintained.

Since the climate protection is integrated with the cassette 1 where the contacts 3 are placed, an assembler can hardly forget the climate protection during installation. This is especially true if the cabinet 17 is made so that it cannot be closed unless the cassette 1 is in its proper position. Furthermore, installation and service are relatively simple and rapid procedures since everything is easily accessible and no extra protectors need to be mounted or removed.

What is claimed is:

1. Device for connecting a cable (2) to electronic equipment (20), which is arranged in a cabinet (17), the shell of which protects the equipment (20), said shell being provided with an opening (18) to an inner space for connections to said equipment (20), and through which opening (18) said cable (2) is arranged, the device comprising a cassette (1), which can be removably fastened essentially in the inner space in connection with said opening (18), and in which a number of cable connections are arranged, characterized in that at least a portion of at least one surface (12) of the cassette (1) is provided with ventilation holes (10) to obtain, by means of air flow-through, a climate condition inside the cassette resembling that prevailing inside the shell of the cabinet.

2. Device according to claim 1, characterized in that the cassette (1) is provided with a front panel (7) provided with at least one environmentally shielding inlet for at least one cable (2), and an inner contact device (3), which is arranged to connect the cable (2) to inner connections (4) for the inner parts of the cabinet (17).

3. Device according to claim 2, characterized in that said contact device (3) is arranged on a surface (9) of the cassette (1) forming a boundary to the inner space (C) in the cabinet (17), said surface not being provided with ventilation holes.

4. Device according to claim 3, characterized in that the contact device (3) is arranged on a surface (9) of the cassette (1) facing towards the front panel (7).

5. Device according to claim 2, characterized in that the cassette (1), EMC-shielding in itself, is fixed to said shell by means of the front panel (7) and is provided with EMC-shielding (15) at the fastening location, to electromagnetically shield the inner equipment in the cabinet.

* * * * *